(12) United States Patent
Sato et al.

(10) Patent No.: US 11,296,255 B2
(45) Date of Patent: Apr. 5, 2022

(54) MANUFACTURING METHOD OF LIGHT-EMITTING ELEMENT

(71) Applicant: NICHIA CORPORATION, Anan (JP)

(72) Inventors: Kosuke Sato, Anan (JP); Kazuya Nakao, Anan (JP)

(73) Assignee: NICHIA CORPORATION, Anan (JP)

( * ) Notice: Subject to any disclaimer, the term of this patent is extended or adjusted under 35 U.S.C. 154(b) by 224 days.

(21) Appl. No.: 16/751,589

(22) Filed: Jan. 24, 2020

(65) Prior Publication Data

US 2020/0243717 A1 Jul. 30, 2020

(30) Foreign Application Priority Data

Jan. 29, 2019 (JP) .............................. JP2019-012935

(51) Int. Cl.
*H01L 33/40* (2010.01)
*H01L 33/38* (2010.01)
*H01L 33/26* (2010.01)

(52) U.S. Cl.
CPC .............. *H01L 33/26* (2013.01); *H01L 33/38* (2013.01); *H01L 33/40* (2013.01); *H01L 2933/0025* (2013.01); *H01L 2933/0033* (2013.01); *H01L 2933/0075* (2013.01)

(58) Field of Classification Search
CPC ............. H01L 33/26; H01L 2933/0025; H01L 2933/0033; H01L 2933/0075; H01L 33/40; H01L 33/38; H01L 2933/0016
See application file for complete search history.

(56) References Cited

U.S. PATENT DOCUMENTS

| 2013/0181244 A1 | 7/2013 | Sato et al. |
| 2015/0287887 A1 | 10/2015 | Sato et al. |
| 2016/0118544 A1 | 4/2016 | Sato et al. |

FOREIGN PATENT DOCUMENTS

| DE | 102013113191 A1 * | 5/2015 | ........... H01L 33/005 |
| JP | S57-30376 A | 2/1982 | |
| JP | S62-22438 A | 1/1987 | |
| JP | H01-307228 A | 12/1989 | |
| JP | H06-53244 A | 2/1994 | |
| JP | 2003-257973 A | 9/2003 | |
| JP | 2013-165252 A | 8/2013 | |

* cited by examiner

*Primary Examiner* — Hoang-Quan Ho
(74) *Attorney, Agent, or Firm* — Foley & Lardner LLP

(57) ABSTRACT

A method of manufacturing a light-emitting element including, in the following order, steps of: preparing a wafer on which a semiconductor layer including an light-emission layer is formed; forming a resist film comprising a main body and a protrusion; forming a first metal film; forming a second metal film on the resist film and on the first metal film; pulling the protrusion of the resist film upward by raising and then lowering a temperature of the wafer; forming a third metal film on the second metal film and covering an end of the first metal film by the third metal film; and removing the resist film. In the step of forming the second metal film, the end of the first metal film is exposed from the second metal film.

20 Claims, 10 Drawing Sheets

MANUFACTURING METHOD OF LIGHT-EMITTING ELEMENT

CROSS-REFERENCE TO RELATED PATENT APPLICATION

The present application claims priority under 35 U. S. C. § 119 to Japanese Patent Application No. 2019-012935, filed Jan. 29, 2019, the contents of which are hereby incorporated by reference in their entirety.

BACKGROUND

The present disclosure relates to a method of manufacturing a light-emitting element.

A method of manufacturing a light-emitting element has been proposed in which a reflecting film and a barrier film are formed after forming an overhanging resist film (refer to Japanese Patent Publication No. 2013-165252).

SUMMARY

However, with the method of manufacturing a light-emitting element described in Japanese Patent Publication No. 2013-165252, there is a risk that obstruction by an overhanging portion may prevent the barrier film from being formed so as to cover an end of the reflecting film, and the reflecting film may migrate from the end.

Example embodiments of the present invention are described below.

According to one embodiment, a method of manufacturing a light-emitting element includes, in the following order, steps of: preparing a wafer on which a semiconductor layer including a light-emission layer is formed; forming a resist film having, in a sectional view, a main body in contact with a first region on the semiconductor layer and a protrusion that protrudes over a second region on the semiconductor layer from the main body without coming into contact with the second region, the second region being adjacent to the first region; forming a first metal film in a third region on the semiconductor layer, the third region being adjacent to the second region; forming a second metal film on the resist film and on the first metal film; pulling the protrusion of the resist film upward by raising and then lowering a temperature of the wafer; forming a third metal film on the second metal film and covering an end of the first metal film by the third metal film; and removing the resist film, wherein in the step of forming the first metal film, the first metal film is disposed in the third region and in a partial region of the second region, and in the step of forming the second metal film, the end of the first metal film is exposed from the second metal film.

In certain embodiments of the present invention, tensile stress of the second metal film is exerted to pull the protrusion upward, and accordingly, a space formed between the protrusion and the semiconductor layer is widened so as to ensure that the third metal film sufficiently permeates the space. Therefore, the end of the first metal film can be reliably covered by the third metal film, and a light-emitting element with high reliability can be provided by suppressing migration of the first metal film from the end of the first metal film.

DETAILED DESCRIPTION

Hereinafter, methods of manufacturing a light-emitting element according to embodiments of the present invention will be described in detail with reference to the drawings. However, it is to be understood that the description given below is exemplary in nature and is not intended to limit the present invention. In the following description, terms indicating a direction or position may be used (for example, "up", "down", and other terms containing these terms). Such terms are simply used to facilitate understanding of relative directions and positions in the referenced drawings. In addition, sizes, magnitude relationships, and the like of components shown in the drawings may be exaggerated in order to facilitate understanding, and may not necessarily reflect sizes in an actual light-emitting element or magnitude relationships among components in an actual light-emitting element. Furthermore, illustration of each member may be omitted as deemed appropriate in order to facilitate understanding.

Method of Manufacturing Light-Emitting Element According to Embodiments

A method of manufacturing a light-emitting element according to an embodiment includes, in the following order, steps of: preparing a wafer 10 on which a semiconductor layer 12 including a light-emission layer 124 is formed; forming a resist film 14 having, in a sectional view, a main body 142 in contact with a first region X on the semiconductor layer 12 and a protrusion 144 that protrudes over a second region Y on the semiconductor layer 12 from the main body 142 without coming into contact with the second region Y, the second region Y being adjacent to the first region X; forming a first metal film 162 in a third region Z on the semiconductor layer 12, the third region Z being adjacent to the second region Y; forming a second metal film 164 on the resist film 14 and on the first metal film 162; pulling the protrusion 144 of the resist film 14 upward by raising and then lowering a temperature of the wafer 10; forming a third metal film 166 on the second metal film 164 and covering an end of the first metal film 162 by the third metal film 166; and removing the resist film 14, wherein in the step of forming the first metal film 162, the first metal film 162 is disposed in the third region Z and in a partial region of the second region Y, and in the step of forming the second metal film 164, the end of the first metal film 162 is exposed from the second metal film 164. Hereinafter, the respective steps will be described in order.

Step of Preparing Wafer 10

Figure 1A:
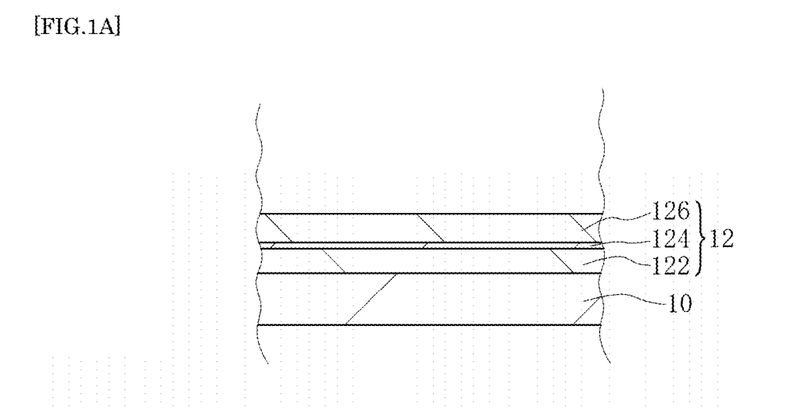
FIG. 1A is a schematic sectional view illustrating a method of manufacturing a light-emitting element according to an embodiment.

First, as shown in FIG. 1A, a wafer 10 on which a semiconductor layer 12 including a light-emission layer 124 is prepared. The preparation of the wafer 10 may be performed by placing the wafer 10 inside a film deposition apparatus and forming the semiconductor layer 12 on the placed wafer 10 or by placing, inside the film deposition apparatus, the wafer 10 on which the semiconductor layer 12 had been formed in advance. One or a plurality of light-emission layers can be formed on one wafer. One semiconductor layer may have one or a plurality of light-emission layers. When a plurality of light-emission layers are formed, one or two or more light-emission layers correspond to one light-emitting element. It is assumed that one light-emitting element is provided with an electrode 16 (the electrode 16 includes first to third metal films to be described below) in addition to the semiconductor layer 12.

As the wafer 10, for example, a base body fabricated by growing a raw material in a columnar shape referred to as an ingot and thinly slicing the ingot can be used. The wafer 10 can have various shapes such as a plate shape in a sectional view. Alternatively, the wafer 10 can have a disk shape in a plan view. However, the wafer 10 may have a portion formed by removing a part of a disk in a plan view in order to enable an orientation of the wafer 10 to be readily identified. A thickness of the wafer 10 is not particularly limited. For example, the thickness of the wafer 10 can be set to 50 μm or more and 300 μm or less. Alternatively, the thickness of the wafer 10 may be set to 75 μm or more and 250 μm or less, or 100 μm or more and 200 μm or less. A size of the wafer 10 is not particularly limited. For example, the size of the wafer 10 can be set to a wafer diameter of 50 mm or more and 150 mm or less. Examples of a material of the wafer 10 include silicon carbide (SiC), ZnS, ZnO, Si, GaAs, insulating materials, and oxide materials. Insulating materials include sapphire ($Al_2O_3$) and spinel ($MgAl_2O_4$). Oxide materials include lithium niobate, neodymium gallate, and the like.

The semiconductor layer 12 preferably includes a first conductive semiconductor layer 122 and a second conductive semiconductor layer 126 formed on a partial region of the semiconductor layer 12, and in particular, preferably includes the first conductive semiconductor layer 122, the light-emission layer 124, and the second conductive semiconductor layer 126 in this order. For example, a conductivity type of the first conductive semiconductor layer 122 is one of an n-type and a p-type, and a conductivity type of the second conductive semiconductor layer 126 is the other of an n-type and a p-type. For example, the n-type semiconductor layer may be doped with a donor. In addition, for example, the p-type semiconductor layer may be doped with an acceptor. The light-emission layer 124 is also referred to as an active layer and may have a structure such as a single quantum well structure or a multiple quantum well structure formed on a thin film that generates a quantum effect. Types and materials of the first conductive semiconductor layer 122, the light-emission layer 124, and the second conductive semiconductor layer 126 are not particularly limited. For example, a gallium nitride-based semiconductor material such as $In_XAl_YGa_{1-X-Y}N$ ($0 \leq X$, $0 \leq Y$, $X+Y \leq 1$) is suitably used. The first conductive semiconductor layer 122, the light-emission layer 124, and the second conductive semiconductor layer 126 may each be a monolayer, a multilayer made up of two or more layers, or a stack structure of superlattices or the like. A thickness of each of the first conductive semiconductor layer 122, the light-emission layer 124, and the second conductive semiconductor layer 126 as well as a thickness of the entire semiconductor layer 12 are not particularly limited and can be appropriately adjusted in accordance with intended characteristics, materials used, and the like. The thickness of each layer is a distance (for example, a shortest distance) between an upper surface and a lower surface of each layer. Different portions of a single layer may have different thicknesses or a same thickness in a sectional view.

A first region X, a second region Y, and a third region Z exist on the semiconductor layer 12. The second region Y is a region adjacent to the first region X, and the third region Z is a region adjacent to the second region Y. A main body 142 of a resist film 14 to be described below is formed in the first region X, and a protrusion 144 of the resist film 14 to be described below is positioned over the second region Y. The first to third regions may be provided on a semiconductor in a singular manner or a plurality of the first to third regions may be provided in a matrix pattern. While the first to third regions are, for example, a partial region of the upper surface of the semiconductor layer 12, when another layer is formed on the upper surface of the semiconductor layer, the first to third regions may constitute a partial region of an upper surface of the other layer.

Step of Forming Resist Film 14

Figure 1B:
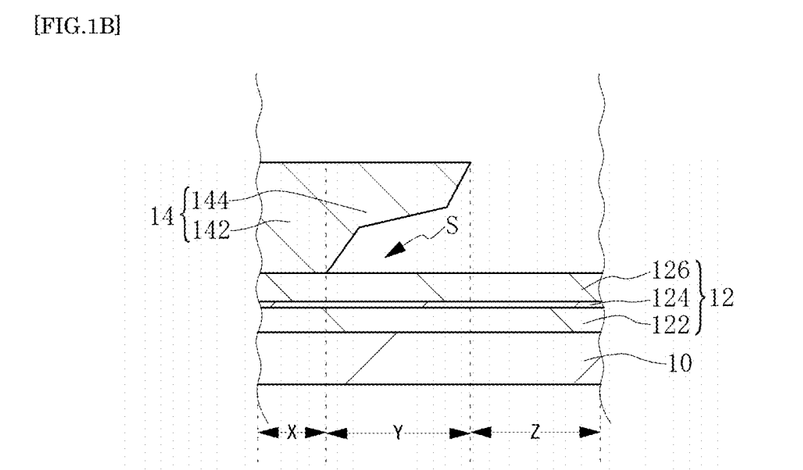
FIG. 1B is a schematic sectional view illustrating the method of manufacturing a light-emitting element according to the embodiment.

Next, as shown in FIG. 1B, the resist film 14 is formed on the semiconductor layer 12. The resist film 14 is a member for forming an electrode 16 (first to third metal films to be described below) in a prescribed shape on the semiconductor layer 12. The resist film 14 includes a main body 142 and a protrusion 144.

The main body 142 is a portion having a function for patterning the electrode 16 in a prescribed shape. The main body 142 is in contact with the first region X on the semiconductor layer 12 in a sectional view. The electrode 16 is not formed in the first region X where the main body 142 is formed. A thickness of the main body 142 is preferably set to, for example, 0.5 or more and 10 μm or less, and may be set to 1 μm or more and 5 μm or less. However, the thickness of the main body 142 is preferably equal to or greater than a film thickness of the electrode 16, and preferably two times the film thickness of the electrode 16 or more. A film thickness of the electrode 16 is a distance from a lower surface to an upper surface of the electrode 16: specifically, a distance from a lower surface of the first metal film 162 to an upper surface of the third metal film 166 to be described below. This is because when the thickness of the main body 142 is less than the film thickness of the electrode 16, there is a risk that the first to third metal films formed on the third region Z of the semiconductor layer 12 and the first to third metal films formed on the main body 142 may become continuous and burrs may occur at ends of the first to third metal films formed on the third region Z. A burr refers to a phenomenon in which a part of a metal film peels off from the semiconductor layer 12 so as to accompany the removed resist film 14 and ends up disrupting the shape of the metal film.

The protrusion 144 is a portion that protrudes over the second region Y from the main body 142. The protrusion 144 is, for example, a portion that protrudes in a horizontal direction or, in other words, a direction from the first region X toward the second region Y from a lateral surface of the main body 142 in a sectional view. The protrusion 144 is positioned above the second region Y on the semiconductor layer 12 but is not in contact with the second region Y. In other words, a space S is formed between the protrusion 144 and an upper surface of the second region Y. The protrusion 144 has a function for separating the first to third metal films from the lateral surface of the main body 142 so as to prevent at least one metal film among the first to third metal films from attaching to the lateral surface of the resist film 14. Due to the protrusion 144, the first to third metal films formed in the third region Z on the semiconductor layer 12 and the first to third metal films formed on the main body 142 can be reliably separated from each other. As a result, an occurrence of burrs at the ends of the first to third metal films formed on the third region Z can be suppressed.

In a sectional view, a length of the protrusion 144 is preferably set to, for example, 2 or more and 5 μm or less and more preferably set to 3 μm or more and 4 μm or less. Due to the length of the protrusion 144 being 2 μm or more, the first to third metal films formed in the third region Z on the semiconductor layer 12 and the first to third metal films formed on the main body 142 can be more reliably separated from each other. In addition, due to the length of the protrusion 144 being 5 μm or less, the protrusion 144 can be more readily pulled upward in a temperature raising/lowering step to be described below. This is because when the length of the second region Y (the length of the protrusion 144 in the horizontal direction) is too long, stress necessary for pulling the protrusion 144 upward becomes excessive and makes it difficult to pull the protrusion 144 upward. In this case, the length of the protrusion 144 is a length of the protrusion 144 in the horizontal direction in a sectional view and can be defined as, for example, a length equal to the length of the second region Y in a sectional view.

In a sectional view, a thickness of the protrusion 144 is preferably set to, for example, 2 or more and 4 μm or less, and more preferably set to 2 μm or more and 3 μm or less. Due to the thickness of the protrusion 144 being 2 μm or more, the first to third metal films formed in the third region Z on the semiconductor layer 12 and the first to third metal films formed on the main body 142 can be prevented from becoming continuous. In addition, due to the thickness of the protrusion 144 being 3 μm or less, the protrusion 144 can be pulled upward in a temperature raising/lowering step to be described below. This is because when the length of the protrusion 144 in the vertical direction is too long, stress necessary for pulling the protrusion 144 upward becomes excessive and makes it difficult to pull the protrusion 144 upward. In this case, the thickness of the protrusion 144 is a length of the protrusion 144 in the vertical direction in a sectional view and can be defined as, for example, a distance from a portion of a lower surface of the protrusion 144 that is farthest from the second region Y to a portion of an upper surface of the protrusion 144 that is farthest from the second region Y in a sectional view.

While the conditions related to the length and the thickness of the protrusion 144 described above are preferably satisfied in any one sectional view, the conditions are more preferably satisfied in any sectional view. Accordingly, the first to third metal films formed in the third region Z on the semiconductor layer 12 and the first to third metal films formed on the main body 142 can be more reliably separated from each other, and at the same time, the protrusion 144 can be more readily pulled upward in a temperature raising/lowering step to be described below.

The resist film 14 can be formed in a prescribed shape using, for example, a photolithographic method and an etching method. For example, the resist film 14 is exposed using a mask having an opening with a prescribed shape or a mask that covers a prescribed shape. While the resist film 14 having an opening is formed when the mask has an opening, in this case, the protrusion 144 is disposed at a circumference of the opening of the resist film 14 (for example, a circumference on an outer side of the opening or a region that is in contact with, and encloses, an outer periphery of the opening) and the main body 142 is disposed on a further outer side of the protrusion 144. An exposure amount is preferably set as appropriate from a range of about 10 mJ to 50 mJ. Baking may be performed at an arbitrary temperature for an arbitrary period of time before and after the exposure. Subsequently, the resist film 14 is patterned to a prescribed shape by immersion development, spray development, or the like using a developer that dissolves a resist present in an exposed portion or a non-exposed portion of the resist film 14. The developer used at this point may be suitably selected in accordance with a type of the resist used. Examples of the developer include tetramethyl ammonium hydroxide (TMAH) and tetrabutyl ammonium hydroxide (TBAH). For example, when a novolac-based resin is used as the resist, TMAH is preferably used as the developer.

The resist film 14 can be formed using a photoresist composition normally used in the technical field of light-emitting elements. Specifically, as the resist film 14, photoresist compositions constituted by various materials classified into novolac-diazo naphthoquinone (DNQ)-based photoresists, positive photoresists, negative photoresists, chemically amplified photoresists, photocrosslinkable photoresists, photopolymerized photoresists, and the like can be used. Any commercially-available product of such photoresist compositions can be used. A resist layer can be formed using various methods including a screen coating method, a spin coating method, a roll coating method, a laminator method, a dip coating method, and a spray coating method.

Step of Forming First Metal Film 162

Figure 1C:
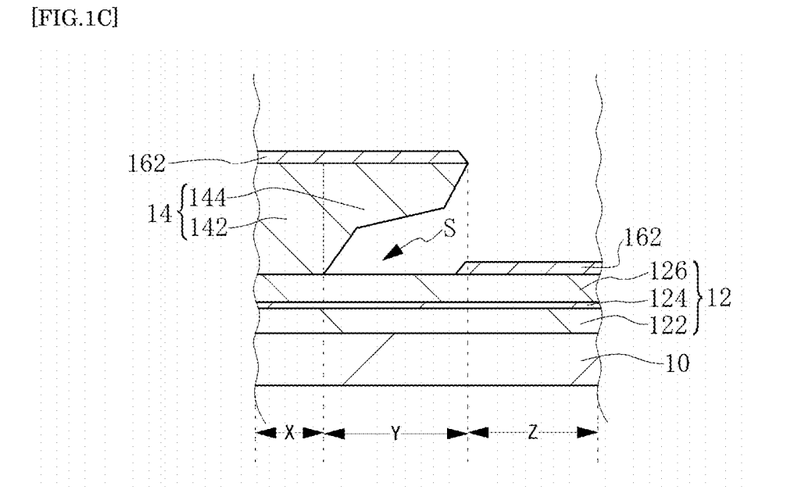
FIG. 1C is a schematic sectional view illustrating the method of manufacturing a light-emitting element according to the embodiment.

Next, as shown in FIG. 1C, the first metal film 162 is formed in the third region Z on the semiconductor layer 12.

Because the main body 142 is not formed in the second region Y, a part of the metal material constituting the first metal film 162 penetrates under the protrusion 144. As a result, the first metal film 162 is disposed in a partial region of the second region Y in addition to the third region Z. The first metal film 162 is a part of the electrode 16, and a lower surface of the first metal film 162 constitutes a lower surface of the electrode 16. The first metal film 162 preferably comes into electrical ohmic contact with the semiconductor layer 12 and preferably comes into contact with the semiconductor layer 12. In case, the third region Z constitutes a partial region of the upper surface of the semiconductor layer 12, the first metal film 162 preferably comes into contact with the third region Z.

Various metal materials such as aluminum (Al) and silver (Ag) can be used as the material of the first metal film 162. In particular, silver (Ag) is preferably used. By using silver (Ag) having high light reflectivity as the material of the first metal film 162, for example, light extraction efficiency of a light-emitting element that emits blue or green light can be improved. Although silver (Ag) is prone to causing migration, according to the present embodiment, because the end of the first metal film 162 can be reliably covered by the third metal film 166, the light extraction efficiency of a light-emitting element can be improved while suppressing migration of the first metal film 162 from the end thereof. It should be noted that a migration of the first metal film 162 from the end thereof means an occurrence of, for example, a deficit, a loss, or the like of the end of the first metal film 162.

For example, the first metal film 162 can be formed by a vapor deposition method, a sputtering method, or the like.

Step of Forming Second Metal Film 164

Figure 1D:
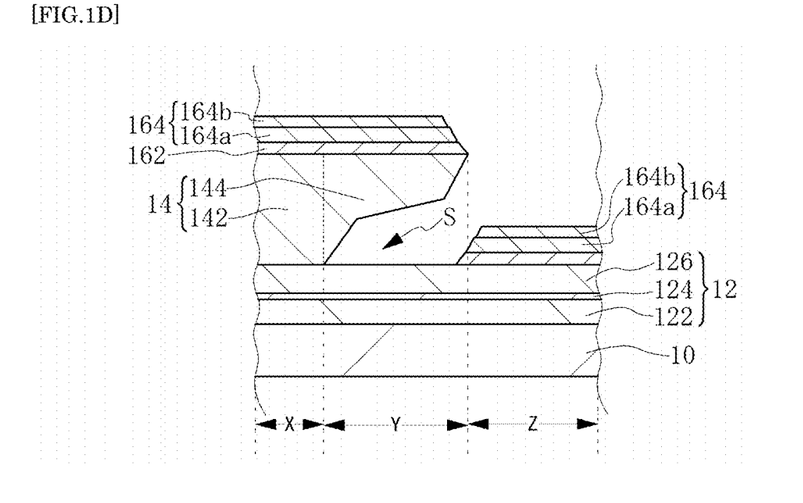
FIG. 1D is a schematic sectional view illustrating the method of manufacturing a light-emitting element according to the embodiment.

Next, as shown in FIG. 1D, the second metal film 164 is formed on the resist film 14 and on the first metal film 162. However, the second metal film 164 is formed using, as-is, the resist film 14 that was used when forming the first metal film 162. Nevertheless, because the resist film 14 has the protrusion 144, a metal material constituting the second metal film 164 is blocked by the protrusion 144 and it is difficult for the metal material constituting the second metal film 164 to sufficiently permeate the space S formed between the protrusion 144 and the semiconductor layer 12. Therefore, with the situation as it is, it is difficult to cover the end of the first metal film 162 with the second metal film 164, and there is a risk that the end of the first metal film 162 may be exposed from the second metal film 164. Therefore, in the present embodiment, by raising and subsequently lowering a temperature of the wafer 10, a tensile stress of the second metal film 164 is exerted to pull the protrusion 144 upward.

For example, the second metal film 164 can be formed by a vapor deposition method, a sputtering method, or the like.

Step of Raising and Subsequently Lowering Temperature of Wafer 10

Figure 1E:
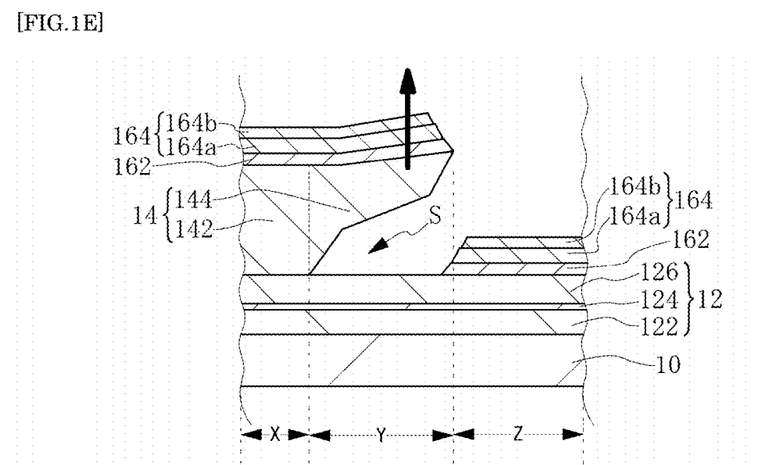
FIG. 1E is a schematic sectional view illustrating the method of manufacturing a light-emitting element according to the embodiment.

Next, the temperature of the wafer 10 is first raised and subsequently lowered. Accordingly, the protrusion 144 is pulled upward as shown in FIG. 1E. The protrusion 144 being pulled upward means that, for example, due to the protrusion 144 warping or curling back in a sectional view, the space S formed between the lower surface of the protrusion 144 and the second region Y of the semiconductor layer 12 widens. Before raising or lowering temperature, the second metal film 164 may be exerting compressive stress that is greater than tensile stress with respect to the protrusion 144. In this case, tensile stress refers to stress by which the second metal film 164 pulls the protrusion 144, and in FIG. 1E, refers to a force oriented upward. In addition, compressive stress refers to stress by which the second metal film 164 pushes down the protrusion 144, and in FIG. 1E, refers to a force oriented downward. Characteristics of the second metal film 164 change due to raising or lowering temperature, so that greater tensile stress than compressive stress is exerted. Alternatively, when the second metal film 164 exerts greater tensile stress than compressive stress with respect to the protrusion 144 before raising or lowering temperature, raising or lowering temperature causes the second metal film 164 to exert even greater tensile stress with respect to the protrusion 144. In the present embodiment, by raising or lowering temperature in this manner, the tensile stress of the second metal film 164 is exerted to pull the protrusion 144 upward. Accordingly, the space S between the protrusion 144 and the semiconductor layer 12 is widened to ensure that the third metal film 166 sufficiently permeates the space S and that the end of the first metal film 162 (the first metal film 162 and the second metal film 164) is reliably covered by the third metal film 166. Due to the space S formed between the protrusion 144 and the semiconductor layer 12 being widened in a sectional view, for example, a distance from the second region Y to a portion of the lower surface of the protrusion 144 that is farthest from the second region Y is preferably increased by 0.1 μm or more and more preferably increased by 0.5 μm or more. Alternatively, a distance to the portion of the lower surface of the protrusion 144 that is farthest from the second region Y is preferably increased by 3% of the thickness of the main body 142 or more and more preferably increased by 10% of the thickness of the main body 142 or more.

As materials having the characteristics described above, for example, nickel, ruthenium, rhodium, and tungsten can be preferably used for the second metal film 164. The second metal film 164 need only have one or more of these metal materials, and the second metal film 164 is preferably constituted by only one or more of these metal materials in order to ensure that a greater tensile stress can be exerted by raising or lowering temperature. In particular, among the metal materials described above, nickel provides strong tensile stress with respect to the resist film 14 and can be preferably used as a material of the second metal film 164.

Although the second metal film 164 may be a monolayer film, the second metal film 164 is preferably a multilayer film. When the second metal film 164 is a multilayer film having a first layer 164a and a second layer 164b that is formed on the first layer 164a, the first layer 164a preferably comprises one or more of nickel, ruthenium, rhodium, and tungsten, and the second layer 164b preferably comprises platinum, gold, or an alloy thereof. In the step of raising or lowering the temperature of the wafer 10, for example, the wafer 10 may be removed from a film deposition apparatus and placed inside a heat treatment apparatus, subjected to heat treatment, and subsequently removed from the heat treatment apparatus and once again placed inside the film deposition apparatus. In this case, there is a risk that the wafer 10 is exposed to air after being removed from the film deposition apparatus and before being placed inside the heat treatment apparatus or after being removed from the heat treatment apparatus and before once again placed inside the film deposition apparatus, thereby causing oxidation of surfaces of the first metal film and the second metal film and increasing electrical resistivity of the light-emitting element. However, when the second layer 164b includes platinum, gold, or an alloy thereof, which are less susceptible to oxidation, oxidation of the surfaces of the first metal film and the second metal film can be suppressed and an increase in electrical resistivity can be reduced. While the second metal film 164 includes the first layer 164a and the second layer 164b in the present embodiment, the second metal film 164 may be a monolayer or may be constituted by three or more layers.

A film thickness of the second metal film 164 is preferably greater than the film thickness of the first metal film 162. In addition, the thickness of the second metal film 164 is preferably 7% or more and 30% or less with respect to the thickness of the main body 142 of the resist film 14 in a sectional view. Making the thickness of the second metal film 164 7% of the thickness of the main body 142 or more enables the tensile stress of the second metal film 164 to be exerted more effectively and enhances the effect of pulling the protrusion 144 upward with the second metal film 164. Therefore, the space S formed between the protrusion 144 and the semiconductor layer 12 can be more reliably widened. In addition, making the thickness of the second metal film 164 30% of the thickness of the main body 142 or less enables an occurrence of a situation where the main body 142 of the resist film 14 is also pulled upward and the main body 142 peels off from the first surface of the semiconductor layer 12 to be prevented. When the thickness of the second metal film 164 is not uniform and the thickness can be measured in plurality, for example, a measurement value representing a smallest value can be adopted as the thickness of the second metal film 164. A similar logic applies to the thickness of the resist film 14.

The increase in temperature is preferably performed by heating the wafer 10 at a temperature of 130 degrees or higher and 150 degrees or lower for a period of 15 minutes or more and 20 minutes or less. Heating at a temperature of 130 degrees or higher and 150 degrees or lower need only be a state that can be evaluated as substantially applying heat at a temperature of 130 degrees or higher and 150 degrees or lower, and a temperature at a certain location in an atmosphere where the wafer 10 is placed may fall below 130 degrees or exceed 150 degrees. Heating at a temperature of 130 degrees or higher for 15 minutes or more enables the tensile stress of the second metal film 164 to be sufficiently exerted. On the other hand, because excessively heating the resist film 14 has a risk of causing the resist film 14 to deform and making removal thereof difficult, heating at a temperature of 150 degrees or lower while keeping the heating time to or under 20 minutes enables such risks to be suppressed.

Step of Forming Third Metal Film 166

Figure 1F:
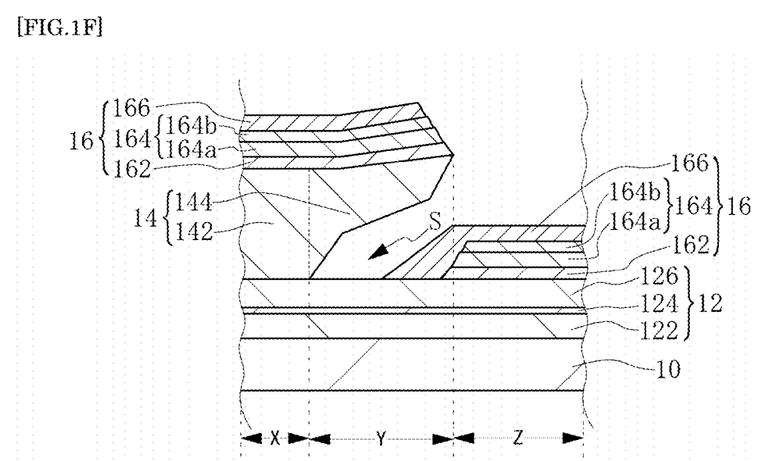
FIG. 1F is a schematic sectional view illustrating the method of manufacturing a light-emitting element according to the embodiment.

Next, as shown in FIG. 1F, the third metal film 166 is formed on the second metal film 164, and an end of the first metal film 162 and an end of the second metal film 164 are covered by the third metal film 166. The third metal film 166 may be formed on the resist film 14 in addition to being formed on the second metal film 164. The third metal film 166 is formed using, as-is, the resist film 14 used when forming the first metal film 162. However, due to the step of raising and then lowering the temperature of the wafer 10, the protrusion 144 of the resist film 14 has been pulled upward and the space S between the protrusion 144 and the semiconductor layer 12 has been widened. Therefore, due to the present step, the third metal film 166 can be formed so as to sufficiently permeate the space S and the end of the first metal film 162 can be reliably covered by the third metal film 166. In order to improve adhesion force with the second metal film 164, the third metal film 166 is preferably in contact with an upper surface of the second metal film 164 and a lateral surface of the first metal film 162. In addition, when a part of an upper surface of the first metal film 162 is exposed from the second metal film 164, the third metal film 166 is preferably in contact with the exposed upper surface of the first metal film 162. Accordingly, migration of the first metal film 162 can be more reliably suppressed.

While metal materials such as titanium, nickel, platinum, ruthenium, rhodium, and gold can be used as a material of the third metal film 166, among these materials, the third metal film 166 preferably includes titanium, platinum, or both. Using either titanium or platinum for the third metal film 166 enables adhesion with a protective film 30 that is formed on the third metal film 166 to be improved.

For example, the third metal film 166 can be formed by a vapor deposition method, a sputtering method, or the like. Generally, when a metal film is formed by a sputtering method, it is difficult to cause the metal material to permeate to deep or remote parts. For example, the protrusion 144 becomes an obstacle and prevents the metal material from sufficiently permeating the space S between the protrusion 144 and the semiconductor layer 12. Therefore, when the third metal film 166 is formed by a sputtering method, there is a risk that the third metal film 166 cannot reliably cover the end of the first metal film 162. However, in the present embodiment, tensile stress of the second metal film 164 with respect to the resist film 14 is exerted to pull the protrusion 144 upward, and accordingly, the space S between the protrusion 144 and the semiconductor layer 12 is widened so as to ensure that the third metal film 166 sufficiently permeates the space S. Therefore, the present embodiment suppresses migration of the first metal film 162 from an end thereof while forming the third metal film 166 by a sputtering method. Accordingly, because all of the first to third metal films can also be formed by a sputtering method, steps can be simplified and a manufacturing cost of a light-emitting element can be reduced.

Step of Removing Resist Film 14

Figure 1G:
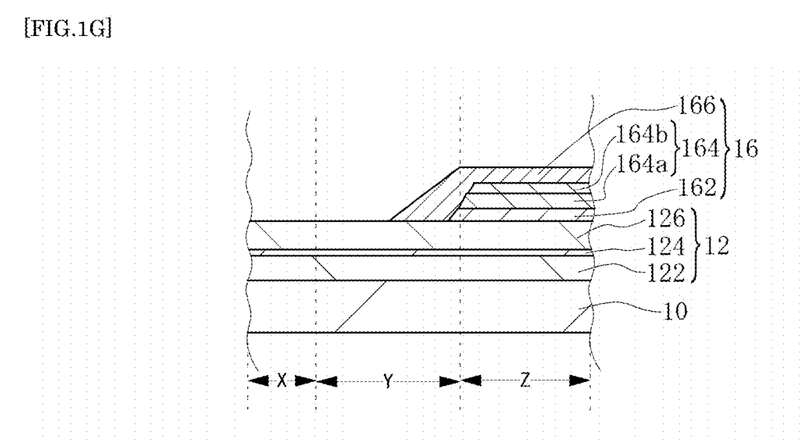
FIG. 1G is a schematic sectional view illustrating the method of manufacturing a light-emitting element according to the embodiment.

Next, as shown in FIG. 1G, the resist film 14 is removed. Accordingly, the first to third metal films formed on the resist film 14 are removed together with the resist film 14 and the first to third metal films having a prescribed shape are formed. For example, the resist film 14 can be removed using a lift-off method. As a solvent used in the lift-off method, for example, a stripping liquid can be used. For example, the resist layer and the first to third metal films on the resist layer are removed together by ultrasonic cleaning. According to the present embodiment, because the end of the first metal film 162 can be reliably covered by the third metal film 166, a situation where the end of the first metal film 162 is melted by the solvent used in the lift-off method or the like and disappears can be suppressed.

After removing the resist film 14, by singulating a single wafer 10 in units of one or two or more light-emission layers 124, the single wafer 10 can be divided into a plurality of light-emitting elements. Singulation can be performed by methods such as dicing and laser machining. After removing the resist film 14, the wafer 10 may or may not be removed from the semiconductor layer 12 and a completed light-emitting element may or may not have the wafer 10. Separation of the wafer 10 from the semiconductor layer 12 can be performed by a method such as laser lift-off.

As described above, in an embodiment of the present invention, tensile stress of the second metal film 164 is exerted to pull the protrusion 144 upward, and accordingly, the space S formed between the protrusion 144 and the semiconductor layer 12 is widened so as to ensure that the third metal film 166 sufficiently permeates the space S. Therefore, an end of the first metal film 162 can be reliably covered by the third metal film 166, and a light-emitting element with high reliability can be provided by suppressing migration of the first metal film 162 from the end.

Method of Manufacturing Light-Emitting Element According to Comparative Example

Figure 7:
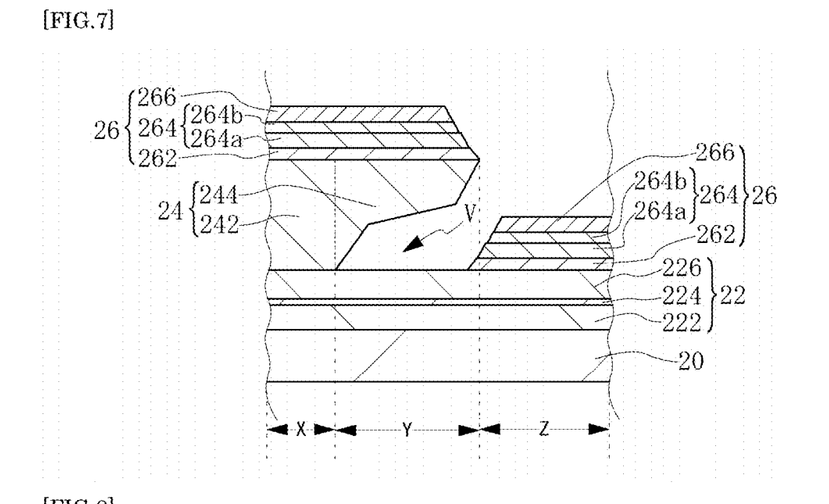
FIG. 7 is a schematic sectional view illustrating a method of manufacturing a light-emitting element according to a comparative example.

FIG. 7 is a schematic sectional view illustrating a method of manufacturing a light-emitting element according to a comparative example. As shown in FIG. 7, because the protrusion is not pulled upward in the method of manufacturing a light-emitting element according to the comparative example, a metal material constituting a second metal film 264 is blocked by a protrusion 244 and it is difficult for the metal material constituting the second metal film 264 to sufficiently permeate a space V formed between the protrusion 244 and a semiconductor layer 22. Therefore, it is difficult to cover an end of a first metal film 262 with the second metal film 264 and the end of the first metal film 262 is exposed from the second metal film 264. In addition, even if a third metal film 266 is formed on the second metal film 264, in a similar manner to the second metal film 264, it is difficult to cover the end of the first metal film 262 with the third metal film 266.

Light-Emitting Element 1 According to Embodiments

Figure 2A:
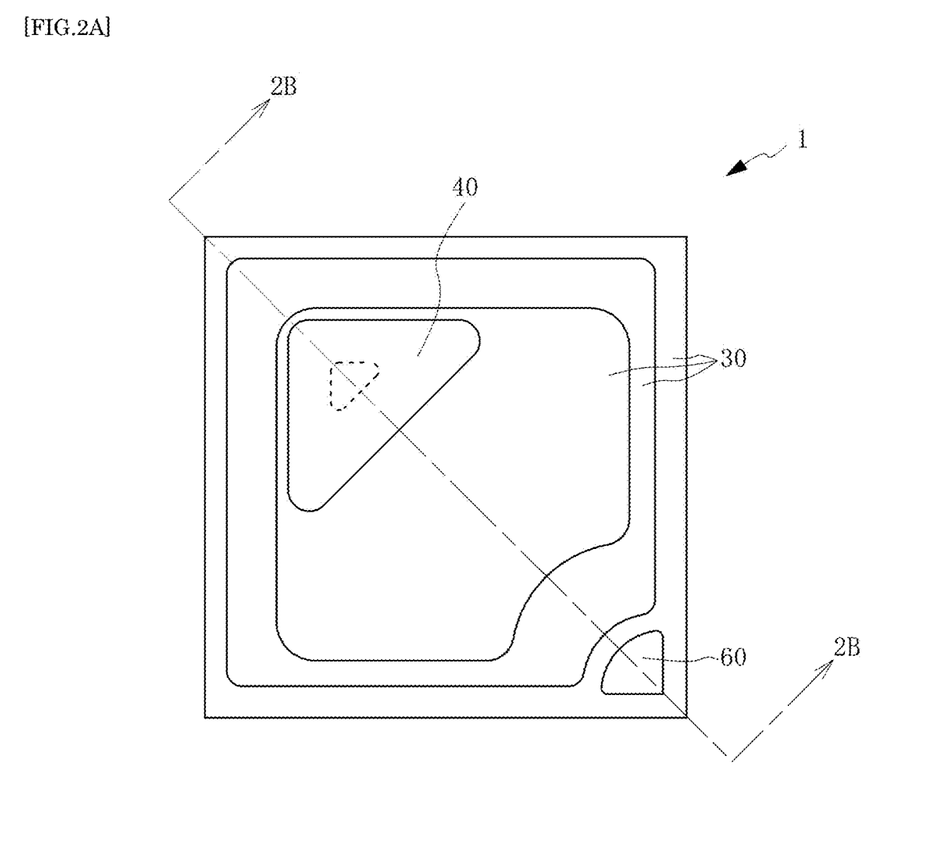
FIG. 2A is a schematic plan view illustrating a light-emitting element according to an embodiment.
Figure 2B:
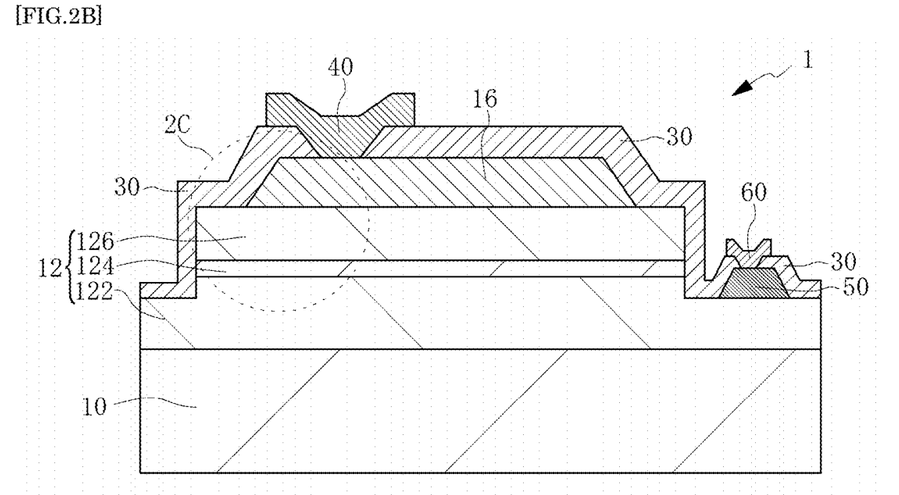
FIG. 2B is a diagram showing a schematic section taken along line 2B-2B in FIG. 2A.
Figure 2C:
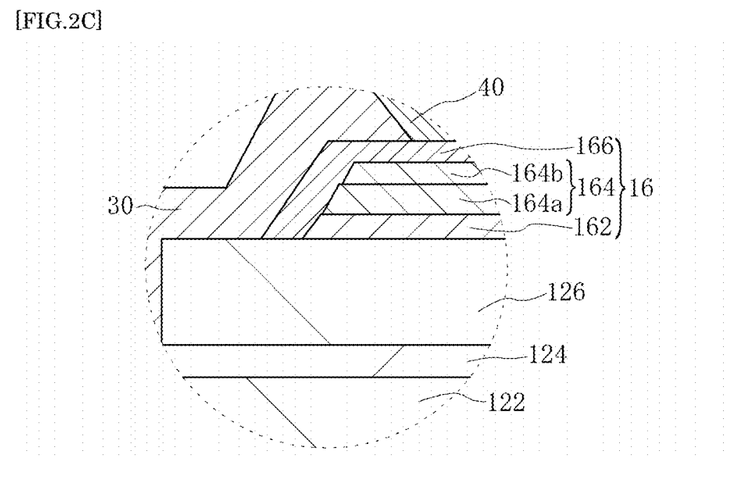
FIG. 2C is an enlarged view of part 2C in FIG. 2B.

Next, embodiments of a light-emitting element will be described with reference to FIGS. 2A to 2C. While a light-emitting element 1 can be manufactured by the method of manufacturing a light-emitting element according to the embodiment described above, the light-emitting element 1 may also be manufactured by other methods. FIGS. 2A to 2C illustrate one of a plurality of light-emitting elements obtained by singulating the wafer 10 after removing the resist film 14.

FIG. 2A is a schematic plan view illustrating a light-emitting element according to the present embodiment, and FIG. 2B is a diagram showing a section 2B-2B in FIG. 2A. As shown in FIGS. 2A and 2B, the light-emitting element 1 according to the present embodiment includes a substrate 10, a semiconductor layer 12 formed on the substrate 10, an electrode 16 formed on a second conductive semiconductor layer 126, a first electrode 40 (for example, a p-side electrode) that is electrically connected to the electrode 16, an electrode 50 that is electrically connected to a first conductive semiconductor layer 122, a second electrode 60 (for example, an n-side electrode) that is electrically connected to the electrode 50, and a protective film 30 that covers surfaces of the semiconductor layer 12 and the electrode 16 and that has an opening in a part of the surface of the electrode 16. The first electrode 40 and the second electrode 60 can be connected to wires that are connected to an external electrode using a joining material such as a solder material. Alternatively, the first electrode 40 and the second electrode 60 can be electrically connected to an external electrode without wires by using a joint member such as bumps. The substrate 10 is a part of the wafer 10 described above and is denoted by the same reference numeral as the wafer 10. The semiconductor layer 12 includes the first conductive semiconductor layer 122, a light-emission layer 124, and the second conductive semiconductor layer 126. The second electrode 50 is formed on the first conductive semiconductor layer 122, and for example, the second electrode 50 is in contact with the first conductive semiconductor layer 122. The first electrode 40 and the second electrode 60 are respectively in contact with, for example, the electrode 16 and the electrode 50. As a material of the protective film 30, an insulating material such as SiO2 or SiON can be used. The material, thickness, and the like of the substrate 10 are the same as those of the wafer 10 described above and a description thereof will be omitted. In a similar manner, the material, thickness, and the like of each layer and each film are also the same as those adopted by the method of manufacturing a light-emitting element described above and a description thereof will be omitted.

FIG. 2C shows an enlarged view of part 2C in FIG. 2B. As shown in FIG. 2C, in the light-emitting element 1 according to the present embodiment, the electrode 16 includes a first metal film 162, a second metal film 164, and a third metal film 166, and an end of the first metal film 162 is covered by the third metal film 166. Therefore, with the light-emitting element 1 according to the present embodiment, a light-emitting element with high reliability can be provided by suppressing the risk of migration of the first metal film 162 from the end.

Light-Emitting Element According to Comparative Example

Figure 8:
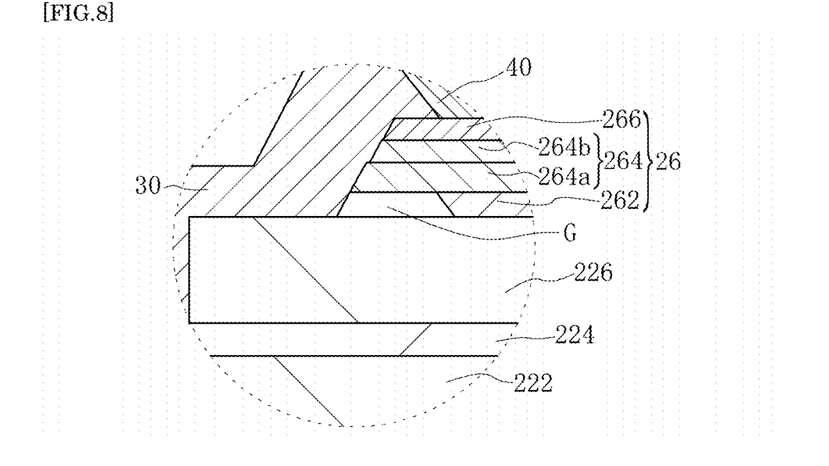
FIG. 8 is a schematic sectional view illustrating a light-emitting element according to the comparative example.

FIG. 8 is a schematic sectional view illustrating a light-emitting element according to a comparative example. As shown in FIG. 8, when the third metal film 266 is formed in a state where the space V between the protrusion 244 and the semiconductor layer 22 is narrow, the end of the first metal film 262 ends up being exposed from the third metal film 266. Therefore, according to the comparative example, migration of the first metal film 262 from the end thereof has caused a loss (disappearance) of a part of the first metal film 262 and a gap G is formed.

EXAMPLES

Material of Second Metal Film 164

Second metal films 164 having different metal materials were formed and the property of pulling the protrusion 144 upward (a degree of action of tensile stress) of each second metal film 164 was verified.

In each case, the verification was carried out by fabricating a sample including the semiconductor layer 12, the resist film 14 on the semiconductor layer 12, and the second metal film 164 on the resist film 14. In each sample used in the present example, the film thickness of the main body 142 of the resist film 14 was approximately 2.7 μm, the length of the protrusion 144 was approximately 3.5 μm, and the thickness of the protrusion 144 was approximately 2.0 μm. It should be noted that, in length measurement using a sectional SEM photograph, angular correction was performed and a length of 1 μm on the sectional SEM photograph was measured as 1.27 μm.

Case where Second Metal Film 164 is Formed Using Nickel

Figure 3A:
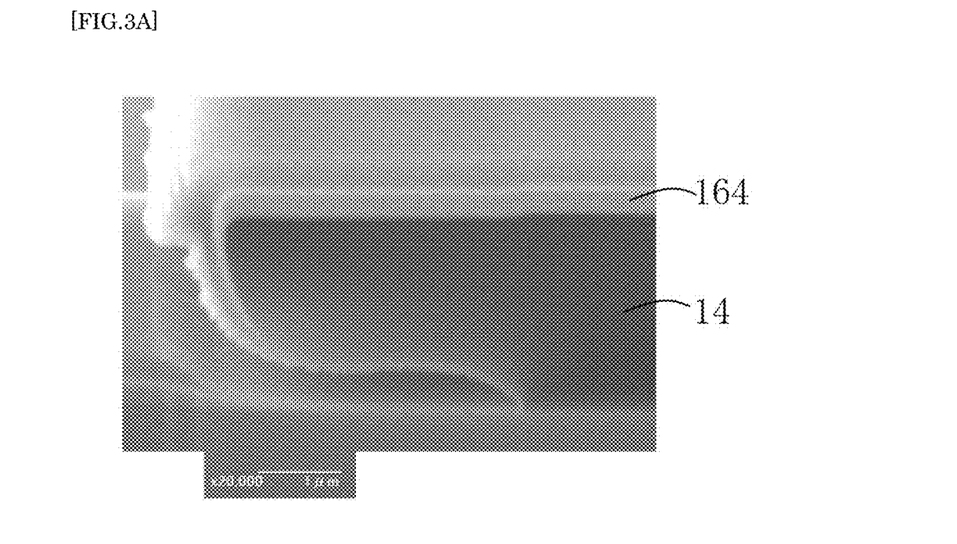
FIG. 3A is a sectional SEM photograph showing a sample in which a second metal film is formed using nickel (Ni)
Figure 3B:
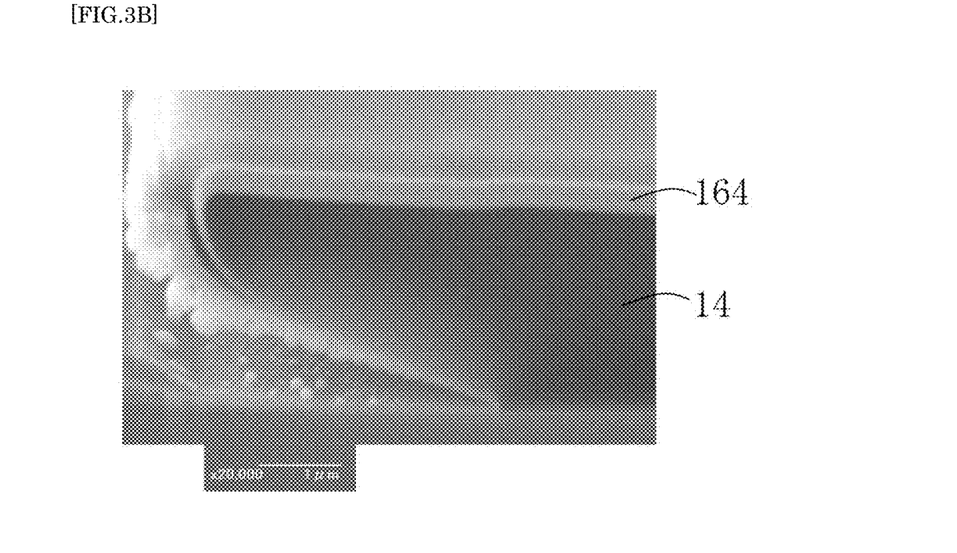
FIG. 3B is a sectional SEM photograph taken after heating the sample shown in FIG. 3A for 15 minutes at 130° C. and then stopping heating and letting the sample stand until the sample reached room temperature.

FIG. 3A is a sectional SEM photograph showing a sample in which the second metal film 164 was formed using nickel (Ni). The film thickness of the second metal film 164 was approximately 0.3 μm. FIG. 3B is a sectional SEM photograph taken after heating the sample shown in FIG. 3A for 15 minutes at 130° C. and then stopping heating and letting the sample stand until the sample reached room temperature. According to FIG. 3A, the distance between the protrusion 144 and the semiconductor layer 12 was approximately 2.9 μm, and according to FIG. 3B, the distance between the protrusion 144 and the semiconductor layer 12 was approximately 3.2 μm. With the second metal film 164 formed using nickel (Ni), tensile stress sufficiently acts and the protrusion 144 can be pulled upward by raising and lowering temperature.

Case where Second Metal Film 164 is Formed Using Rhodium

Figure 4A:
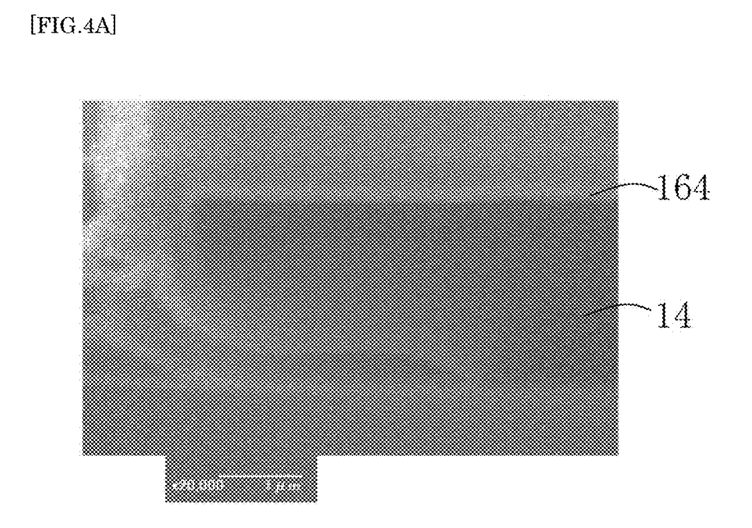
FIG. 4A is a sectional SEM photograph showing a sample in which a second metal film is formed using rhodium (Rh)
Figure 4B:
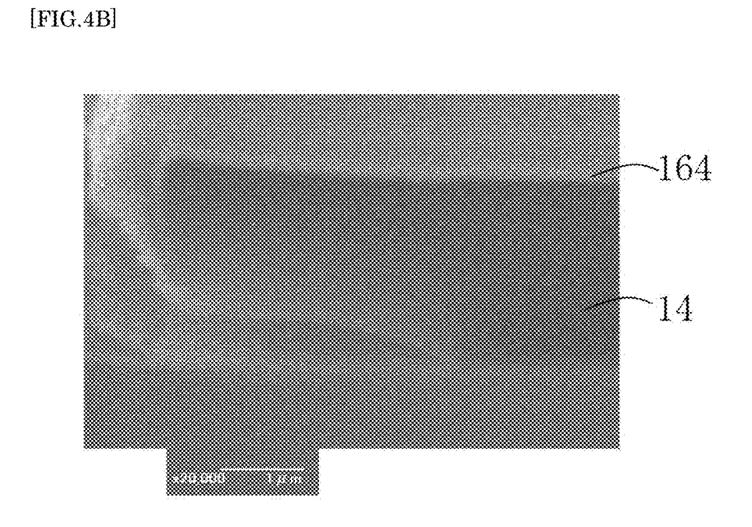
FIG. 4B is a sectional SEM photograph taken after heating the sample shown in FIG. 4A for 15 minutes at 130° C. and then stopping heating and letting the sample stand until the sample reached room temperature.

FIG. 4A is a sectional SEM photograph showing a sample in which the second metal film 164 was formed using rhodium (Rh). The film thickness of the second metal film 164 was approximately 0.2 μm. FIG. 4B is a sectional SEM photograph taken after heating the sample shown in FIG. 4A for 15 minutes at 130° C. and then stopping heating and letting the sample stand until the sample reached room temperature. According to FIG. 4A, the distance between the protrusion 144 and the semiconductor layer 12 was approximately 2.8 µm, and according to FIG. 4B, the distance between the protrusion 144 and the semiconductor layer 12 was approximately 3.2 µm. With the second metal film 164 formed using rhodium (Rh), tensile stress sufficiently acts and the protrusion 144 can be pulled upward by raising and lowering temperature.

Case where Second Metal Film 164 is Formed Using Tungsten

Figure 5A:
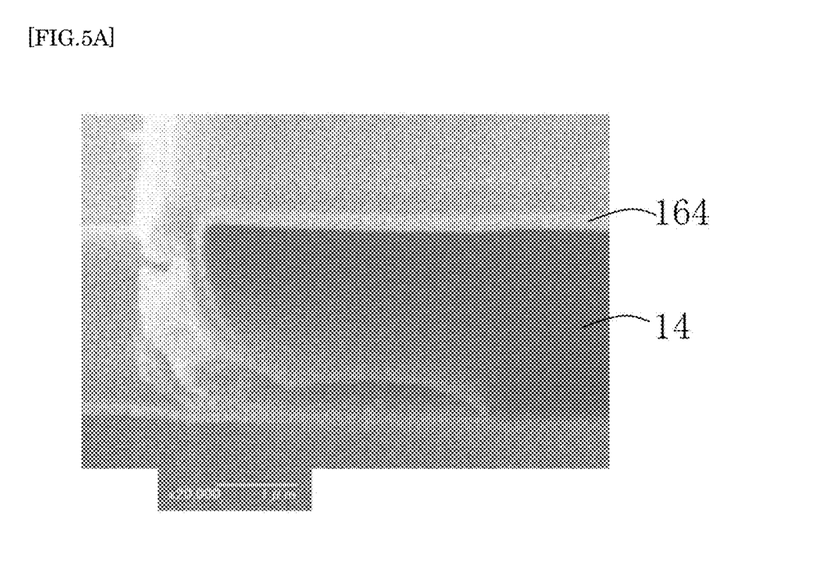
FIG. 5A is a sectional SEM photograph showing a sample in which a second metal film is formed using tungsten (W)
Figure 5B:
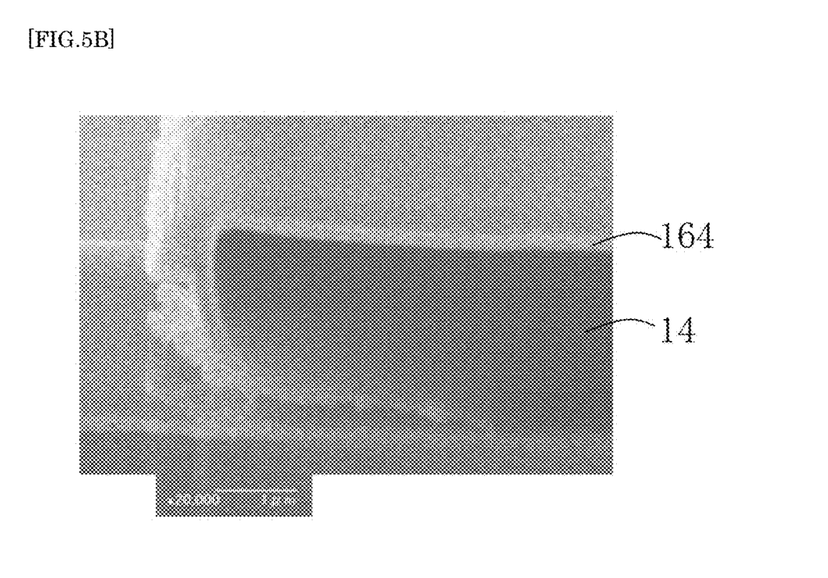
FIG. 5B is a sectional SEM photograph taken after heating the sample shown in FIG. 5A for 15 minutes at 130° C. and then stopping heating and letting the sample stand until the sample reached room temperature.

FIG. 5A is a sectional SEM photograph showing a sample in which a second metal film 164 was formed using tungsten (W). The film thickness of the second metal film 164 was approximately 0.2 µm. FIG. 5B is a sectional SEM photograph taken after heating the sample shown in FIG. 5A for 15 minutes at 130° C. and then stopping heating and letting the sample stand until the sample reached room temperature. According to FIG. 5A, the distance between the protrusion 144 and the semiconductor layer 12 was approximately 3.0 µm, and according to FIG. 5B, the distance between the protrusion 144 and the semiconductor layer 12 was approximately 3.2 µm. With the second metal film 164 formed using tungsten (W), tensile stress sufficiently acts and the protrusion 144 can be pulled upward by raising and lowering temperature.

Case where Second Metal Film 164 is Formed Using Ruthenium

Figure 6A:
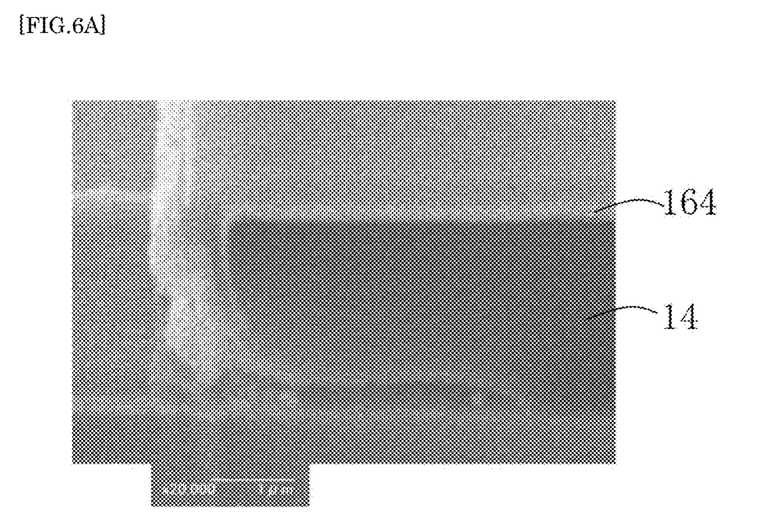
FIG. 6A is a sectional SEM photograph showing a sample in which a second metal film is formed using ruthenium (Ru)
Figure 6B:
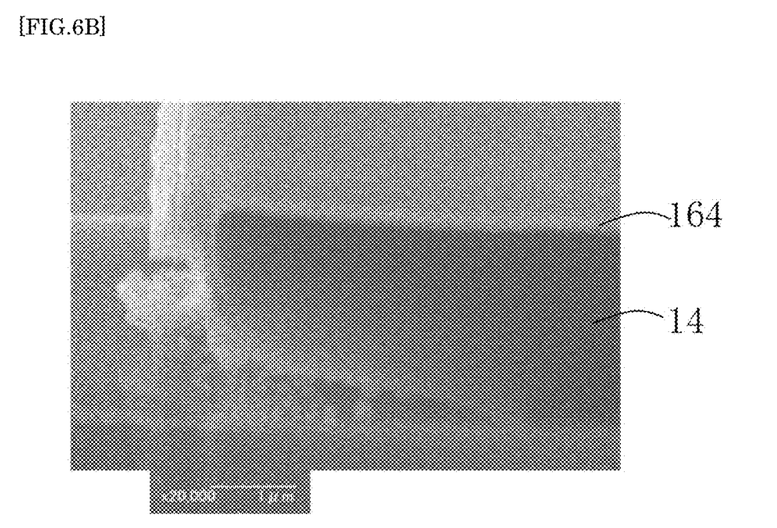
FIG. 6B is a sectional SEM photograph taken after heating the sample shown in FIG. 6A for 15 minutes at 130° C. and then stopping heating and letting the sample stand until the sample reached room temperature.

FIG. 6A is a sectional SEM photograph showing a sample in which a second metal film 164 was formed using ruthenium (Ru). The film thickness of the second metal film 164 was approximately 0.2 µm. FIG. 6B is a sectional SEM photograph taken after heating the sample shown in FIG. 6A for 15 minutes at 130° C. and then stopping heating and letting the sample stand until the sample reached room temperature. According to FIG. 6A, the distance between the protrusion 144 and the semiconductor layer 12 was approximately 3.0 µm, and according to FIG. 6B, the distance between the protrusion 144 and the semiconductor layer 12 was approximately 3.2 µm. With the second metal film 164 formed using ruthenium (Ru), tensile stress sufficiently acts and the protrusion 144 can be pulled upward by raising and lowering temperature.

What is claimed is:

1. A method of manufacturing a light-emitting element, the method comprising, in the following order, steps of:
    preparing a wafer on which a semiconductor layer including a light-emission layer is formed;
    forming a resist film comprising:
        a main body that, in a sectional view, is in contact with a first region on the semiconductor layer, and
        a protrusion that, in the sectional view, protrudes over a second region on the semiconductor layer from the main body without coming into contact with the second region, the second region being adjacent to the first region;
    forming a first metal film in a part of the second region and in a third region on the semiconductor layer, the third region being adjacent to the second region;
    forming a second metal film on the resist film and on the first metal film, such that an end of the first metal film is exposed from the second metal film;
    pulling the protrusion of the resist film upward by raising and then lowering a temperature of the wafer;
    forming a third metal film on the second metal film and covering the end of the first metal film; and
    removing the resist film.

2. The method of manufacturing a light-emitting element according to claim 1, wherein the first metal film comprises silver.

3. The method of manufacturing a light-emitting element according to claim 1, wherein the second metal film comprises one or more of nickel, ruthenium, rhodium, and tungsten.

4. The method of manufacturing a light-emitting element according to claim 1, wherein:
    the second metal film comprises:
        a first layer comprising one or more of nickel, ruthenium, rhodium, and tungsten, and
        a second layer that is disposed on the first layer and that comprises platinum, gold, or an alloy thereof.

5. The method of manufacturing a light-emitting element according to claim 1, wherein the third metal film comprises titanium, platinum, or both.

6. The method of manufacturing a light-emitting element according to claim 1, wherein a film thickness of the second metal film is greater than a film thickness of the first metal film.

7. The method of manufacturing a light-emitting element according to claim 2, wherein a film thickness of the second metal film is greater than a film thickness of the first metal film.

8. The method of manufacturing a light-emitting element according to claim 3, wherein a film thickness of the second metal film is greater than a film thickness of the first metal film.

9. The method of manufacturing a light-emitting element according to claim 4, wherein a film thickness of the second metal film is greater than a film thickness of the first metal film.

10. The method of manufacturing a light-emitting element according to claim 1, wherein the third metal film is formed by a sputtering method.

11. The method of manufacturing a light-emitting element according to claim 1, wherein the temperature is raised by heating the wafer at a temperature of 130 degrees or higher and 150 degrees or lower for a period of 15 minutes or more and 20 minutes or less.

12. The method of manufacturing a light-emitting element according to claim 2, wherein the temperature is raised by heating the wafer at a temperature of 130 degrees or higher and 150 degrees or lower for a period of 15 minutes or more and 20 minutes or less.

13. The method of manufacturing a light-emitting element according to claim 1, wherein a length of the protrusion in a sectional view is 2 µm or more and 5 µm or less.

14. The method of manufacturing a light-emitting element according to claim 2, wherein a length of the protrusion in a sectional view is 2 µm or more and 5 µm or less.

15. The method of manufacturing a light-emitting element according to claim 3, wherein a length of the protrusion in a sectional view is 2 µm or more and 5 µm or less.

16. The method of manufacturing a light-emitting element according to claim 4, wherein a length of the protrusion in a sectional view is 2 µm or more and 5 µm or less.

17. The method of manufacturing a light-emitting element according to claim 1, wherein a thickness of the protrusion in a sectional view is 2 µm or more and 4 µm or less.

18. The method of manufacturing a light-emitting element according to claim 2, wherein a thickness of the protrusion in a sectional view is 2 µm or more and 4 µm or less.

19. The method of manufacturing a light-emitting element according to claim 3, wherein a thickness of the protrusion in a sectional view is 2 µm or more and 4 µm or less.

20. The method of manufacturing a light-emitting element according to claim 4, wherein a thickness of the protrusion in a sectional view is 2 μm or more and 4 μm or less.

* * * * *